(12) United States Patent
Lee

(10) Patent No.: US 11,126,376 B2
(45) Date of Patent: Sep. 21, 2021

(54) APPARATUS AND METHOD FOR PERFORMING RECOVERY OPERATION OF MEMORY SYSTEM

(71) Applicant: SK hynix Inc., Icheon (KR)

(72) Inventor: Jong-Min Lee, Seoul (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/570,614

(22) Filed: Sep. 13, 2019

(65) Prior Publication Data

US 2020/0159455 A1 May 21, 2020

(30) Foreign Application Priority Data

Nov. 20, 2018 (KR) .......................... 10-2018-0143510

(51) Int. Cl.
*G06F 3/06* (2006.01)

(52) U.S. Cl.
CPC .......... *G06F 3/0659* (2013.01); *G06F 3/0604* (2013.01); *G06F 3/064* (2013.01); *G06F 3/0653* (2013.01); *G06F 3/0673* (2013.01)

(58) Field of Classification Search
CPC .... G06F 3/0659; G06F 3/0604; G06F 3/0673; G06F 3/064; G06F 3/0653; G06F 11/14; G06F 11/1471; G06F 11/3476

USPC ........................................................ 711/154
See application file for complete search history.

(56) References Cited

U.S. PATENT DOCUMENTS

| | | | |
|---|---|---|---|
| 10,522,230 B2 * | 12/2019 | Lee ........................ | G11C 16/14 |
| 10,643,558 B2 * | 5/2020 | Su ......................... | G09G 3/3607 |
| 2015/0186224 A1 * | 7/2015 | Lin ....................... | G06F 12/0246 714/6.12 |
| 2019/0369705 A1 * | 12/2019 | Pathak .................. | G06F 1/3228 |

FOREIGN PATENT DOCUMENTS

| KR | 101615907 B1 | 4/2016 |
|---|---|---|
| KR | 20160055723 A | 5/2016 |
| KR | 101639672 B1 | 7/2016 |

* cited by examiner

*Primary Examiner* — Hua J Song

(57) ABSTRACT

A method for operating a memory system includes performing a block access task on a first block in a memory device, the memory device having a plurality of blocks, generating log information when a power supply voltage becomes lower than a given level, the log information including a check point and block information, the check point indicating the block access task, the block information indicating a second block, and performing the block access task on the second block indicated in the block information of the log information when the power supply voltage becomes equal to or greater than the given level.

18 Claims, 11 Drawing Sheets

APPARATUS AND METHOD FOR PERFORMING RECOVERY OPERATION OF MEMORY SYSTEM

CROSS-REFERENCE TO RELATED APPLICATION

This application claims priority under 35 U.S.C. § 119 to Korean Patent Application No. 10-2018-0143510 filed on Nov. 20, 2018, which is incorporated herein by reference in its entirety.

BACKGROUND

Embodiments relate to a memory system, and more particularly, to a method and apparatus for performing a recovery operation of a memory system due to power supply failure or the like.

The computer environment paradigm has changed to ubiquitous computing systems that can be used anytime and anywhere. That is, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

A memory system is provided power from a power supply device. Due to a sudden power-off (SPO) of the power supply device, the memory system may be seriously damaged. For example, when a flash translation layer (FTL) of a memory system includes logics which need to sequentially access blocks such as a whole memory error-scan, such logics are implemented to record the last accessed block and then access the next block. However, in an environment where an SPO event frequently occurs, the memory system may be powered off and powered on to access a specific block. Then, when the memory system is powered off and powered on, the memory system may access the specific block again and this can cause problems in the memory system.

SUMMARY

Embodiments are directed to a memory system, a data processing system, and an operating method thereof, which can minimize the complexity and performance degradation of the memory system, maximize the use efficiency of a memory device, and rapidly and stably process data in the memory device.

Embodiments are directed to a method and apparatus for performing a recovery operation of a memory system by setting a check point for an event requiring a block access in log information/history information and randomizing a block to be accessed when the event has not been completed, thereby reducing or avoiding repeated access to a specific block during the recovery operation, when power supply failure occurs repeatedly in the memory system.

Embodiments are directed to a method and apparatus which can block repeated access to a specific block in an operation environment of a memory system where a recovery operation may frequently occur, thereby improving the durability of the memory system and increasing the stability of the recovery operation.

The present disclosure is not limited to the advantages listed above. One skilled in the art would realize other advantages based on the disclosure herein.

In accordance with an embodiment of the present invention, a method for operating a memory system includes: performing a block access task on a first block in a memory device, the memory device having a plurality of blocks; generating log information when a power supply voltage becomes lower than a given level, the log information including a check point and block information, the check point indicating the block access task, the block information indicating a second block; and performing the block access task on the second block indicated in the block information of the log information when the power supply voltage becomes equal to or greater than the given level.

In accordance with another embodiment of the present invention, a memory system includes: a memory device including a plurality of blocks; and a controller configured to: performing a block access task on a first block in the memory device; generating log information when a power supply voltage becomes lower than a given level, the log information including a check point and block information, the check point indicating the block access task, the block information indicating a second block; and performing the block access task on the second block indicated in the block information of the log information when the power supply voltage becomes equal to or greater than the given level.

In accordance with still another embodiment of the present invention, a method for operating a memory system includes: performing a block access operation on a first block in a memory device, the memory device including a plurality of blocks; accessing log information after an occurrence of a sudden power-off (SPO) event, the log information including a check point; and continuing the block access operation on a second block different from the first block when the check point of the log information indicates that the block access operation was not completed for the first block.

BRIEF DESCRIPTION OF THE DRAWINGS

The description herein makes reference to the accompanying drawings wherein like reference numerals refer to like parts throughout the several views, and wherein.

DETAILED DESCRIPTION

Hereafter, exemplary embodiments of the present invention will be described with reference to the accompanying drawings. It should be understood that the following descriptions will be focused on portions required for understanding an operation in accordance with an embodiment, and descriptions of the other portions will be ruled out in order not to unnecessarily obscure subject matters of the present disclosure.

Hereafter, exemplary embodiments will be described in detail with reference to the accompanying drawings.

Figure 1:
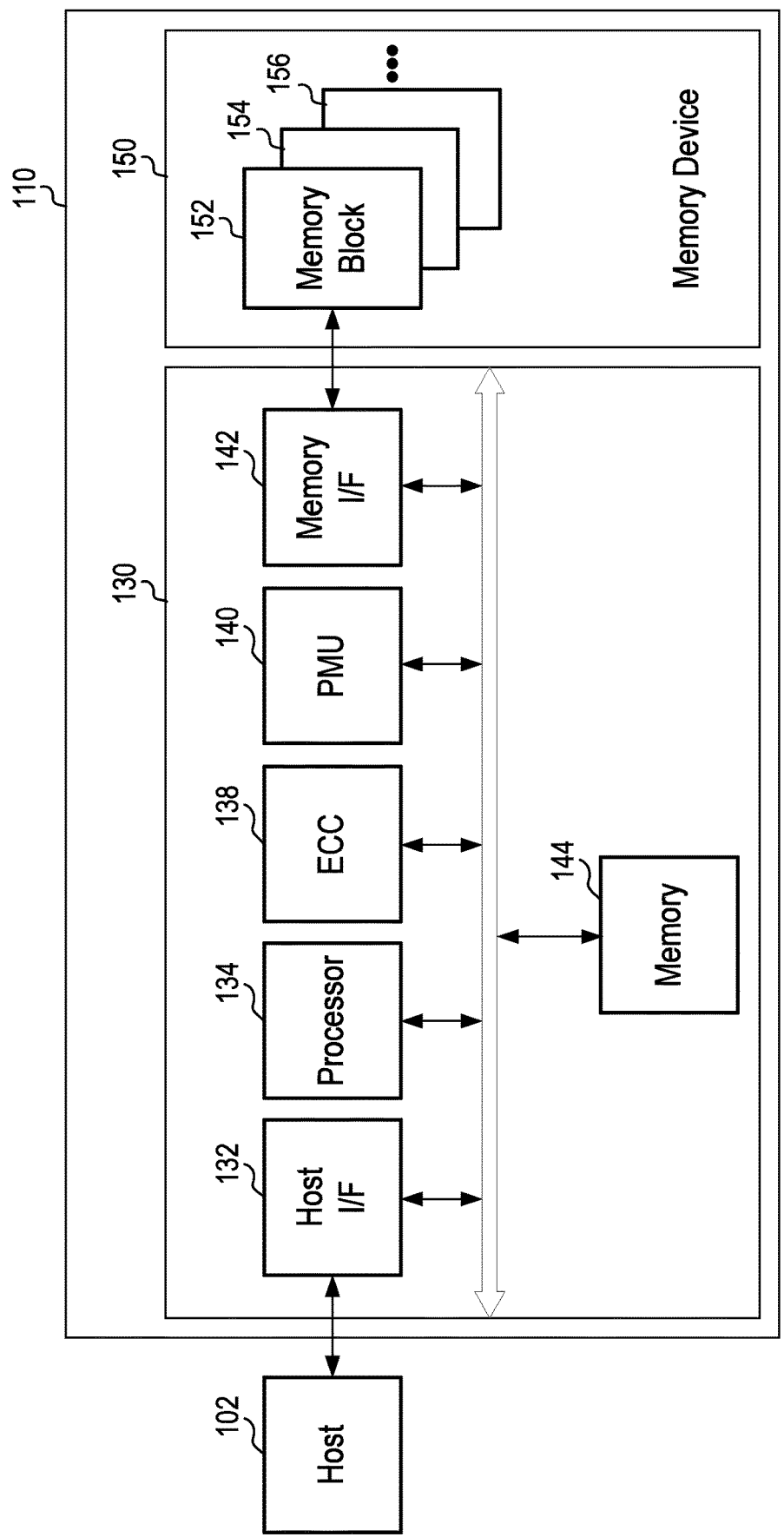
FIG. 1 illustrates a data processing system in accordance with an embodiment.

FIG. 1 illustrates a data processing system 100 in accordance with the present embodiment. The data processing system 100 may include a host 102 and a memory system 110.

The host 102 may include any of portable electronic devices such as a mobile phone, an MP3 player, a laptop computer, and so on, or any of electronic devices such as a desktop computer, a game machine, a TV, a projector, and so on. That is, the host 102 may include a wireless/wired electronic device.

The host 102 may include one or more operating systems (OSs). The OSs may manage and control overall functions and operations of the host 102, and provide an interactive operation between the host 102 and a user who uses the data processing system 100 or the memory system 110. The OSs may support functions and operations corresponding to the intended use of the user.

For example, the OSs may include a general OS and a mobile OS depending on the mobility of the host 102. The general OS may include a personal OS and an industrial OS depending on the use environment of the user. For example, the personal OS is specialized to support a service providing function for general users, and may include Windows, Chrome, and the like. The industrial OS is specialized to secure and support high performance, and may include Windows Server, Linux, Unix, and the like. The mobile OS is specialized to support a mobile service providing function and a system power-saving function for users, and may include Android, iOS, Windows Mobile, and the like.

In this embodiment, the host 102 may include a plurality of OSs, and execute an OS to perform an operation with the memory system 110 according to a user's request. The host 102 may transfer a plurality of requests corresponding to the user's request to the memory system 110, and thus the memory system 110 may perform operations corresponding to the requests, i.e., operations corresponding to the user's request.

The memory system 110 may operate in response to a request from the host 102. In particular, the memory system 110 may store data accessed by the host 102. In other words, the memory system 110 may be used as a main memory device or a secondary memory device of the host 102.

The memory system 110 may be implemented as any one of various types of storage devices, according to a host interface protocol corresponding to the host 102. The various types of storage devices may include a solid state drive (SSD), a multi media card (MMC) such as an embedded MMC (eMMC), a reduced size MMC (RS-MMC), or a micro-MMC, a secure digital (SD) card such as a mini-SD or a micro-SD, a universal storage bus (USB) storage device, a universal flash storage (UFS) device, a compact flash (CF) card, a smart media card a memory stick, and so on.

The storage devices for implementing the memory system 110 may include volatile memory devices and nonvolatile memory devices. The volatile memory devices may include a dynamic random access memory (DRAM), a static RAM (SRAM), and so on. The nonvolatile memory devices may include a read only memory (ROM), a mask ROM (MROM), a programmable ROM (PROM), an erasable programmable ROM (EPROM), an electrically erasable programmable ROM (EEPROM), a ferromagnetic RAM (FRAM), a phase-change RAM (PRAM), a magnetic RAM (MRAM), a resistive RAM (RRAM), a flash memory, and so on.

The memory system 110 may include a memory device 150 for storing data accessed by the host 102 and a controller 130 for controlling data input/output operations of the memory device 150.

For example, the controller 130 and the memory device 150 may be integrated into one semiconductor device. For example, the controller 130 and the memory device 150 may be integrated into one semiconductor device to constitute an SSD. When the memory system 110 is used as the SSD, an operating speed of the host 102 coupled to the memory system 110 may be further improved.

For another example, the controller 130 and the memory device 150 may be integrated into one semiconductor device to constitute a memory card. For example, the controller 130 and the memory device 150 may constitute a memory card such as a personal computer memory card international association (PCMCIA) card, a compact flash (CF) card, a smart media (SM) card, a memory stick, a multimedia card (MMC) such as an RS-MMC or a micro-MMC, an SD card such as a mini-D, a micro-SD, or an SDHC, or a universal flash storage (UFS) device.

For still another example, the memory system 110 may constitute a computer, a ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a potable game machine, a navigation system, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage constituting a data center, a device capable of transmitting/receiving information in a wireless environment, one of various electronic devices constituting a home network, one of various electronic devices constituting a computer network, one of various electronic devices constituting a telematics network, a radio frequency identification (RFID) device, one of various components constituting a computing system, or the like.

The memory device 150 in the memory system 110 may retain data stored therein even though no power is supplied. In particular, the memory device 150 may store data provided from the host 102 by performing a write or program operation, and provide data stored therein to the host 102 by performing a read operation. The memory device 150 may include a plurality of blocks 152, 154, and 156, each of the blocks 152, 154, and 156 may include a plurality of pages, and each of the pages may include a plurality of memory cells coupled to a corresponding one of a plurality of word lines.

In an embodiment, the memory device 150 may include a plurality of memory dies each including a plurality of planes. Each of the plurality of planes may include a plurality of blocks.

The memory device 150 may include a nonvolatile memory device, for example, a flash memory. The flash memory may have a two-dimensional (2D) or three-dimensional (3D) stack structure.

The controller 130 in the memory system 110 may control the memory device 150 in response to a request from the host 102. For example, the controller 130 may provide data read from the memory device 150 to the host 102 in response to a read request, and write data provided from the host 102 in the memory device 150 in response to a write request. For this purpose, the controller 130 may control read, write (or program), and erase operations of the memory device 150.

More specifically, the controller 130 may include a host interface (I/F) 132, a processor 134, an error correction code (ECC) unit 138, a power management unit (PMU) 140, a memory I/F 142, and a memory 144.

The host I/F 132 may process a request and data from the host 102, and communicate with the host 102 through one or more of various interface protocols such as USB, MMC, PCI-E (Peripheral Component Interconnect-Express), SAS (Serial-attached SCSI), SATA (Serial Advanced Technology Attachment), PATA (Parallel Advanced Technology Attachment), SCSI (Small Computer System Interface), ESDI (Enhanced Small Disk Interface), IDE (Integrated Drive Electronics), MIPI (Mobile Industry Processor Interface), and so on. The host I/F 132 may exchange data with the host 102 and may be driven by firmware that is referred to as a host interface layer (HIL).

The ECC unit 138 may perform an error correction operation, and include an ECC encoder and an ECC decoder. The ECC encoder may generate data with a parity bit by performing error correction encoding on write data to be programmed to the memory device 150, and the data with the parity bit may be stored in the memory device 150.

When data stored in the memory device 150 is read, the ECC decoder may detect and correct an error contained in the data read from the memory device 150. In other words, the ECC unit 138 may perform error correction decoding on the data read from the memory device 150, determine whether the error correction decoding is successfully performed, output an indication signal, for example, an error correction success/fail signal according to the determination result, and correct error bits in the read data using a parity bit generated in the error correction encoding process. At this time, when the number of error bits included in the read data is greater than a threshold value that corresponds to the number of correctable error bits, the ECC unit 138 cannot correct the error bits, and thus outputs the error correction fail signal indicating that the ECC unit 138 failed to correct the error bits.

The ECC unit 138 may perform the error correction operation using one or more of a low density parity check (LDPC) code, a Bose, Chaudhri, Hocquenghem (BCH) code, a turbo code, a Reed-Solomon code, a convolution code, a recursive systematic code (RSC), and coded modulation such as trellis-coded modulation (TCM) or block coded modulation (BCM). However, embodiments are not limited thereto. The ECC unit 138 may include all circuits, modules, systems, or devices for performing the error correction operation.

The PMU 140 may provide and manage power for driving the controller 130. That is, the PMU 140 may provide and manage power for driving the components included in the controller 130. The PMU 140 may include a power detector to recognize a state of power applied to the memory system 110, for example, a power-on state, a power-off state, or the like. The power detector may generate an internal control signal corresponding to the power state.

The memory I/F 142 may serve as a memory/storage I/F to provide an interface between the controller 130 and the memory device 150, such that the controller 130 controls the memory device 150 in response to a request from the host 102. When the memory device 150 includes a flash memory, for example, a NAND flash memory, the memory I/F 142 may serve as a NAND flash controller (NFC) The memory I/F 142 may generate a control signal for controlling the memory device 150 and process data of the memory device 150 under control of the processor 134. The memory I/F 142 may be driven by firmware that is referred to as a flash interface layer (FIL).

The memory 144 may serve as a working memory of the memory system 110 and the controller 130, and store data for driving the memory system 110 and the controller 130. More specifically, when the controller 130 controls the memory device 150 in response to a request from the host 102, for example, when the controller 130 controls read, write (or program), and erase operations of the memory device 150 in order to provide data read from the memory device 150 to the host 102 and to write data provided from the host 102 in the memory device 150, the memory 144 may temporarily store the read data and the write data to perform such operations on the memory system 110.

The memory 144 may be implemented with a volatile memory. For example, the memory 144 may include a static random access memory (SRAM), a dynamic random access memory (DRAM), or the like. As illustrated in FIG. 1, the memory 144 may be disposed in the controller 130. However, in another embodiment, the memory 144 may be implemented as an external volatile memory that is disposed outside the controller 130, and the controller 130 may have a memory interface for transferring data between the external volatile memory and the controller 130.

As described above, the memory 144 may store data required for performing a write/read operation between the host 102 and the memory device 150. In order to store such data, the memory 144 may include a program memory, a data memory, a write buffer/cache, a read buffer/cache, a data buffer/cache, a map buffer/cache, and the like.

The processor 134 may control overall operations of the memory system 110. For example, the processor 134 may control a write (or program) operation or a read operation on the memory device 150 in response to a write request or read request from the host 102, respectively. The processor 134 may use firmware to control the overall operations of the memory system 110. The processor 134 may be implemented as a microprocessor or a central processing unit (CPU).

The controller 130 may perform an operation requested by the host 102 in the memory device 150 using the processor 134. In other words, the controller 130 may perform an operation corresponding to a request from the host 102 with the memory device 150. In this case, the controller 130 may perform a foreground operation corresponding to the request from the host 102, for example, a write (or program) operation corresponding to a write request, a read operation corresponding to a read request, an erase operation corresponding to an erase request, or a parameter set operation corresponding to a set parameter command or set feature command as a set request.

The controller 130 may also perform a background operation on the memory device 150 using the processor 134. The background operation may include a garbage collection (GC) operation of copying data stored in an arbitrary block among the blocks 152, 154, and 156 of the memory device 150 into another arbitrary block, a wear leveling (WL) operation of swapping the blocks 152, 154, and 156 of the memory device 150 or data stored in the blocks 152, 154, and 156, a map flush operation of storing map data stored in the controller 130 into the blocks 152, 154, and 156 of the memory device 150, or a bad block management operation of checking and processing a bad block in the memory device 150.

In an embodiment, the controller 130 may also perform a recovery operation of the memory system 110 when a power supply is unstable.

When the power supply is suddenly cut off, i.e., when a sudden power-off (SPO) event occurs, the controller 130 may perform a recover preparation process to generate and save log/history information (referred to as "log information" herein) in the memory device 150. When power is supplied again, the controller 130 may perform a recovery process based on the log information loaded from the memory device 150.

Figure 2:
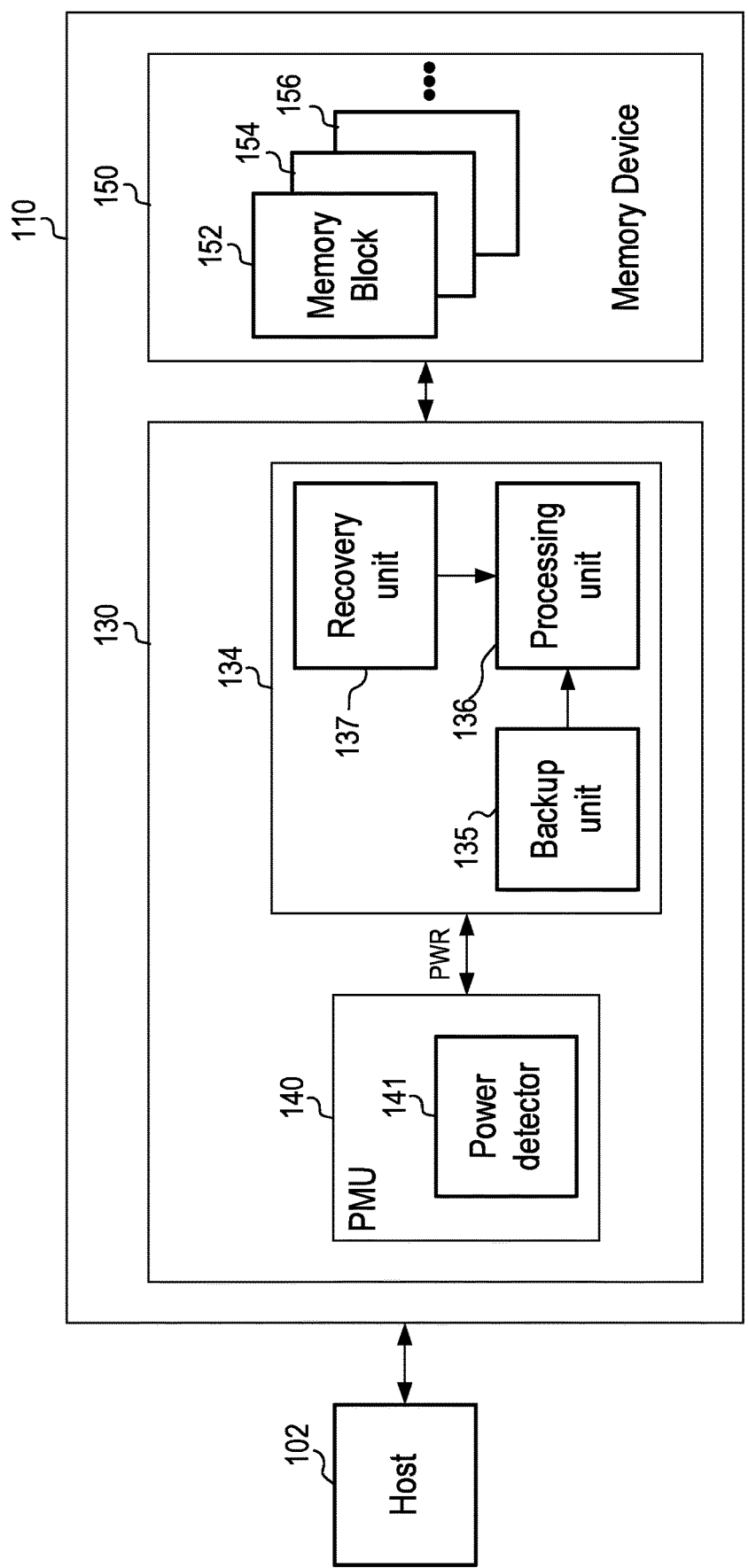
FIG. 2 illustrates a memory system for performing an SPO recovery procedure in accordance with an embodiment.

FIG. 2 illustrates a memory system 110 for performing a recovery operation in accordance with an embodiment. The memory system 110 may include a controller 130 and a memory device 150. The memory system 110 of FIG. 2 may be described with further reference to FIG. 1.

The memory device 150 may include a plurality of blocks 152, 154, and 156. The plurality of blocks 152, 154, and 156 may have a structure in which a plurality of memory cells are coupled through word lines, bit lines, and the like.

When the plurality of blocks 152, 154, and 156 within the memory device 150 are implemented as nonvolatile memories. The plurality of nonvolatile blocks 152, 154, and 156 may be divided into a plurality of areas. For example, the memory device 150 may be divided into a system area for storing system information and a data area for storing user data. The system area may not be allowed for a user to access. The system area may store the system information that includes firmware, map information, log information, and the like. On the other hand, the data area may store user data inputted/outputted by the user.

In an embodiment, the log information stored in the system area may be stored at a random location among the plurality of blocks 152, 154, and 156. However, the user data stored in the data area may be sequentially stored in the plurality of nonvolatile blocks 152, 154, and 156. The system area and the data area may be controlled in different manners, and neither be used together nor overlap each other.

The controller 130 may perform a write (or program) operation for storing new data in the memory device 150, or an operation for reading or erasing data stored in the memory device 150. In addition to general operations such as the read, erase, and write operations, the controller 130 may monitor power applied to the memory system 110, and perform a recovery operation according to the power monitoring result when the power supply to the memory system 110 is unstable.

In order to perform the recovery operation, the controller 130 may include a power detector 141, a backup unit 135, a processing unit 136, and a recovery unit 137.

As illustrated in FIG. 1, when the controller 130 includes the processor 134 and the power management unit 140, the power detector 141 may be included in the power management unit 140, and the backup unit 135, the processing unit 136, and the recovery unit 137 may be implemented by the processor 134. However, embodiments are not limited thereto.

In another embodiment, the backup unit 135 and the recovery unit 137 may be implemented as logic circuits or program algorithms. For example, when the backup unit 135 and the recovery unit 137 are implemented as the program algorithms, the backup unit 135 and the recovery unit 137 may be included in system firmware.

In another embodiment, the power detector 141 may be disposed outside the controller 130.

In an embodiment, the power detector 141 may monitor whether the power supplied to the controller 130 has a level that is lower than a given level. The given level may correspond to a minimum level at which the memory system 110 stably operates.

When the power is stably supplied to the memory system 110 and thus the supplied power becomes equal to or higher than the given level, the power detector 141 may determine that the supplied power is in a stable state and output a power detection signal PWR indicating a normal power state NORMAL_POWER. On the other hand, when the supplied power has a lower level than the given level or no power is supplied, the power detector 316 may determine that the supplied power is in a unstable state and output the power detection signal PWR indicating an abnormal power state LOW_POWER.

When the power is stably supplied to the memory system 110, a request, data, and the like are transferred to the memory system 110 from another device, for example, the host 102. However, the power supplied to the memory system 110 is suddenly cut off or unstable, the memory system 110 cannot perform a normal operation. For example, when the SPO event occurs while the memory system 110 performs an operation corresponding to the request, data, and the like, the operation may be stopped before being completed.

Therefore, in order to enhance reliability in interworking with another device, when power is supplied again, the memory system 110 should return to a previous condition before an occurrence of the SPO event.

In order to return to the previous condition, the memory system 110 may generate and store log information in the memory device 150 when the SPO event occurs, thereby performing a recovery process when power is supplied again.

The log information may include a plurality of events stored in a data structure such as a queue. The plurality of events are sequentially sorted or arranged events that are transferred within a preset time range before the SPO event occurs. The plurality of events may include tasks which were in progress and tasks which are to be performed later when the SPO event occurred. Furthermore, the plurality of events may include tasks which have not reported yet even though the tasks have been already completed. The reporting of the completion of the tasks may be provided to another device, e.g., the host 102.

The log information may be generated by the backup unit 135. For example, when receiving the power detection signal PWR indicating the abnormal power state LOW_POWER from the power detector 141, the backup unit 135 may generate the log information using electrical energy stored in an auxiliary power device (not shown). In an embodiment, the auxiliary power device may include a capacitor capable of storing a minimum amount of electrical energy required for driving the backup unit 135 and the processing unit 136 to perform the recovery preparation process. In an embodiment, the auxiliary power device is disposed inside or outside the controller 130.

When the backup unit 135 generates the log information, the processing unit 136 may store the log information in the memory device 150. After the processing unit 136 stores the log information in the memory device 150, a power state of the memory system 110 may be switched to a power-off state.

When the power is supplied again after the power supply was cut off, the controller 130 may load the system information such as firmware or map information, stored in the memory device 150, to a memory (not illustrated) in the controller 130, and then load the log information to the memory, the log information having been stored when the power supply was cut off.

For example, when the power state of the memory system 110 is switched to a power-on state from the power-off state, the recovery unit 137 may load the log information stored in the memory device 150 to the memory through the processing unit 136. The processing unit 136 may sequentially perform the events stored in the log information, so that the memory system 110 returns to the previous condition before the occurrence of the SPO event.

The operations of the backup unit 135 and the recovery unit 137 may be automatically performed whenever an operation of the memory system 110 abnormally ends due to the power supply failure. When the power supply is cut off after the memory system 110 normally completes all events corresponding to a request from the host 102, the recovery unit 137 may not need to perform the recovery process.

When power is unstably supplied in the operational environment of the memory system 110, e.g., when a power supply unit abnormally operates in a computing device having the memory system 110 mounted therein or power supplied to the computing device is unstable, the memory system 110 may repeatedly perform the recovery operation whenever the power is off and on repeatedly.

The recovery process may include performing the events included in the log information. When the recovery process is repeated, the same tasks included in the events may be repeatedly performed. The repetition of the same tasks may not cause a problem in the memory system 110. However, when the tasks included in the log information require access to a specific block within the memory device 150, the specific block may be repeatedly accessed when the recovery process is repeated. That is, when the recovery process is repeated due to the power supply failure, access to the specific block may be repeated. As a result, properties of the specific block, such as a read count and an erase count, may be degraded.

Therefore, in order to avoid the repeated access to the specific block within the memory device 150, additional information may be contained in the log information. For example, when the tasks included in the log information include a task required to access a block within the memory device 150, the backup unit 135 may insert check points CP at before and after the corresponding task that is referred to as a "block access task."

The check point CP may be associated with block information indicating a block that is being accessed before the power supply is cut off. The backup unit 135 may store information on a randomly decided block as the block information. The block information may be included in the log information.

The recovery unit 137 performing the recovery process may access the randomly decided block within the memory device 150 based on the block information. Since the block used in the recovery process is randomly decided whenever the recovery operation is performed, repeated access to the same block may be avoided even though the same task is repeatedly performed when the recovery process is performed.

For example, when it is assumed that the log information includes a first task of performing a test read on one block among first to tenth blocks within the memory device 150 and the first task has been normally completed, the block information may indicate the next block that is to be accessed in the recovery process.

For example, when the test read has been normally completed on the third block through the first task, the block information may indicate the fourth block on which the next test read operation is to be performed in the recovery process. On the other hand, when power is unstable or the power supply is cut off while the first task is performed, the first task may not be normally completed on the third block. In this case, the backup unit 135 may insert check points at before and after the first task, and randomly select one of the first to tenth blocks in order to generate the block information. That is, the backup unit 135 randomizes the block information. In an embodiment, the backup unit 135 may randomly select one of the first, second, and fourth to tenth blocks except the third block.

Since the first task included in the log information includes accessing a block within the memory device 150, the check points may be located at before and after the first task. During the recovery process, the recovery unit 137 may check the check points in the log information, access the block information, and perform a normal operation on the block indicated by the block information through the processing unit 136.

The test read operation has been exemplified, but various operations may require access to a block in the memory device 150. Examples of the various operations may include a task of allocating a block, a task of writing data in a block, a task of reading data stored in a block, a task of erasing data stored in a block, and so on.

Figure 3:
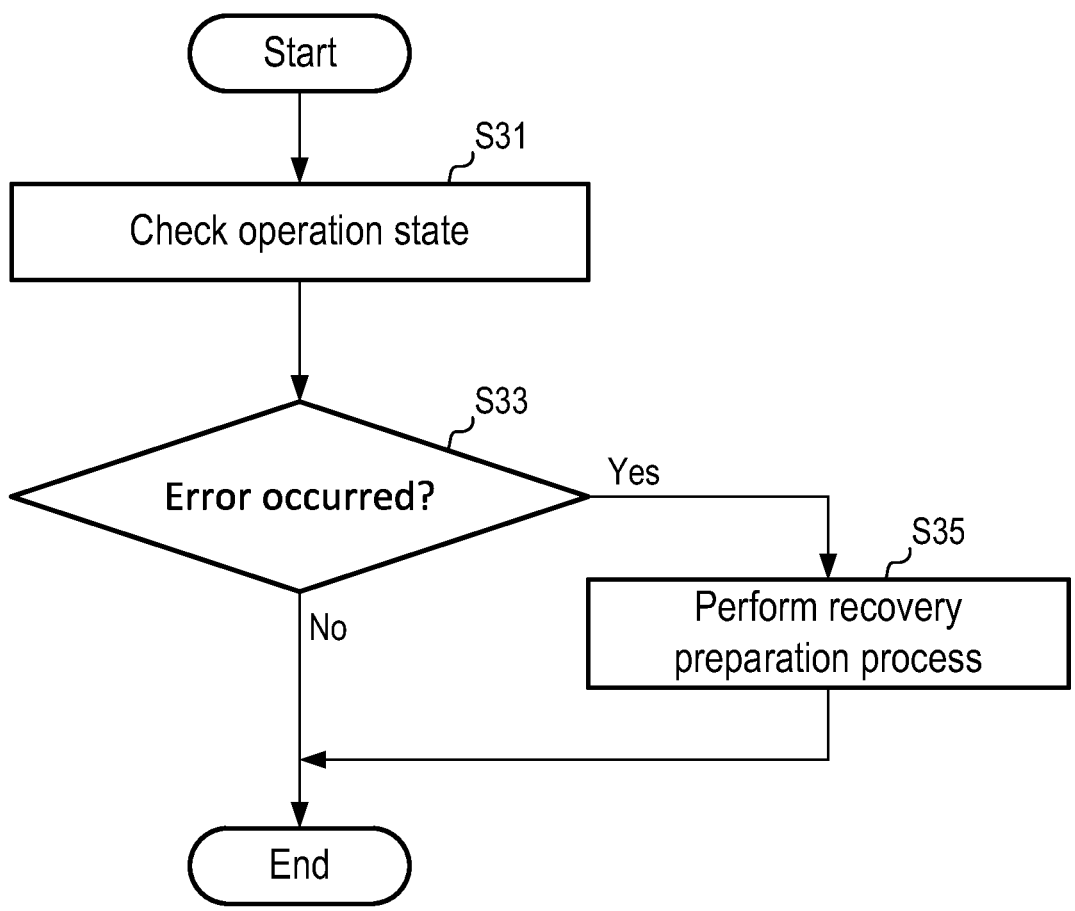
FIG. 3 illustrates a recovery preparation operation of a memory system in accordance with an embodiment.
Figure 4:
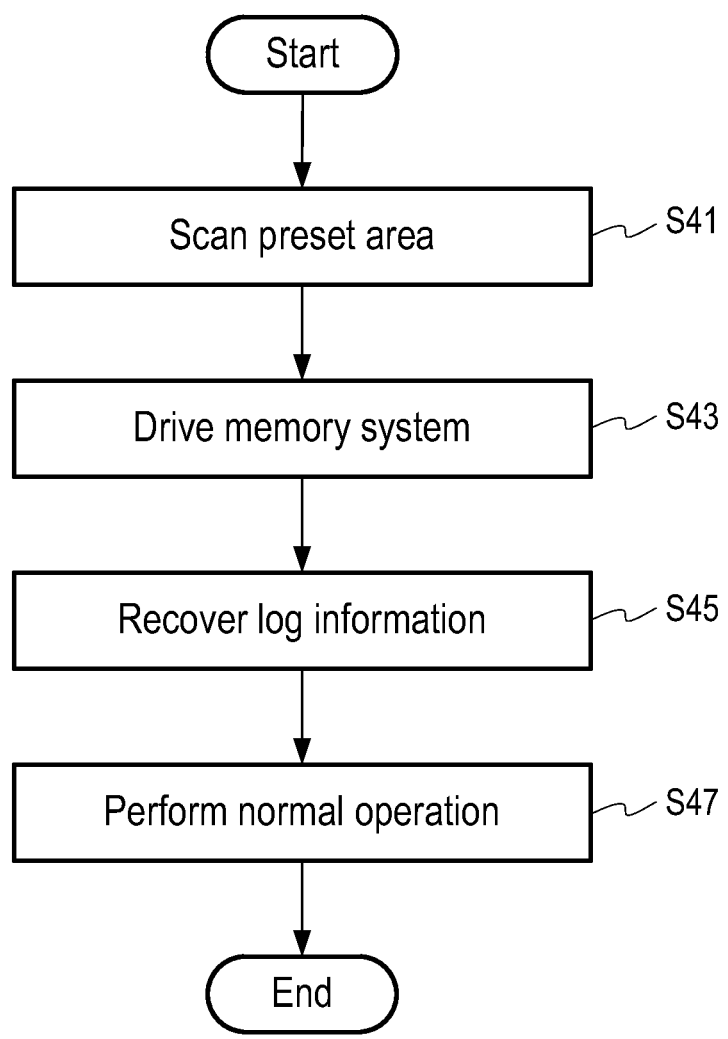
FIG. 4 illustrates a recovery operation of a memory system in accordance with an embodiment.

FIGS. 3 and 4 are flowcharts illustrating a recovery operation of the memory system 110 of FIG. 2 in accordance with an embodiment. Specifically, FIG. 3 illustrates a recovery preparation process of the memory system 110 when the SPO event occurs, and FIG. 4 illustrates a recovery process of the memory system 110 when power is supplied again and stabilized. The recovery operation may include the recovery preparation process and the recovery process. The recovery operation of FIGS. 3 and 4 will be described with reference to FIG. 2.

Referring to FIG. 3, the recovery preparation process of the memory system 110 may be performed when the SPO event occurs while the memory system 110 performs an operation in response to a request from the host 102.

When the SPO event occurs and thus power supplied to the memory system 110 falls below a given level, the memory system 110 may check an operation state of the memory system 110 at S31. At S31, the memory system 110 may check whether a task requested by the host 102 has been completed or not. When the SPO event occurs, the memory system 110 may check an operation state of the task that is in progress, is to be performed, or are not reported yet even though the task has been already completed. The reporting of the completion of the task may be provided to the host 102.

In order to guarantee the reliability of the operation, the memory system 110 may check whether an error occurred in the task based on the checked operation state, at S33. The error may include the case in which the task has not been completed.

When the task is not completed due to the occurrence of the SPO event, i.e., when there is an error as a result of the checking at S33, the memory system 110 may perform the recovery preparation process at S35. The recovery preparation process may include generating log information and storing the log information in the memory device 150. When the recovery preparation process is completed, the memory system 110 may be shut down.

When the power supplied to the memory system 110 is normally cut off, there may not be any task which is abnormally ended or not completed. Therefore, when the backup unit 135 checks whether an error occurred at S33, there is no error checked. In this case, the memory system 110 may be shut down without performing the recovery preparation process.

The recovery preparation process of the memory system 110 is performed to raise the operation reliability, and may be performed by the backup unit 135 and the processing unit 136 of the controller 130 as described above with reference to FIG. 2. The details of the recovery preparation process will be described later.

Referring to FIG. 4, when stabilized normal power is supplied to the memory system 110, the controller 130 may scan a preset area within the memory device 150 at S41. The preset area may include an area in which system information is stored. In an embodiment, the system information may include firmware, map information, log information, and the like.

After scanning the preset area at S41, the memory system 110 may load the system information such as the firmware, the map information, and the log information to a memory within the controller 130. The memory system 110 may be driven based on the system information at S43.

In an embodiment, when the memory system 110 normally completed all tasks before the SPO event occurred, there may be no tasks which the memory system 110 needs to recover when the normal power is applied again. However, when the memory system 110 stored the log information generated in the recovery preparation process, the memory system 110 may recover the log information from the system information at S45. When the log information is recovered, the memory system 110 may return to a normal condition that is the same as the previous condition before the SPO event occurred, and perform tasks included in the log information.

When the memory system 110 recovers the log information and returns to the normal condition, the memory system 110 may perform a normal operation with the host 102 at S47.

In an embodiment, the recovery process of the memory system 110 may be performed until the memory system 110 can perform the normal operation in a condition where the normal power is supplied. However, when power supplied to the memory system 110 is still unstable, power may be repeatedly cut off and supplied while the preset area is scanned or the log information is recovered. In this case, the recovery process of the memory system 110 may be repeatedly performed.

In an embodiment, the recovery process of the memory system 110 may be performed by the recovery unit 137 and the processing unit 136 of the controller 130 as described above with reference to FIG. 2. The details of the recovery process will be described later.

In an embodiment, when a task included in the log information was normally completed before the SPO event occurred, information on the lastly accessed block before the SPO event occurred may be recorded as the block information, and the next block is processed when performing the next normal operation after power is supplied again.

However, in an embodiment, if the task included in the log information was in progress when the SPO event occurred, information on a randomly selected block may be recorded as the block information instead of the information on the lastly accessed block during the recovery preparation process of the memory system 110.

The memory system 110 may use a file system which is more efficient than file systems used in existing computing devices. Examples of the file system which can be used in the memory system 110 may include F2FS (Flash-Friendly File System), JFSS, JFSS2, YAFFS, LogFS, AXFS, RFFS (Reliable Flash File System) and the like.

Figure 5A:
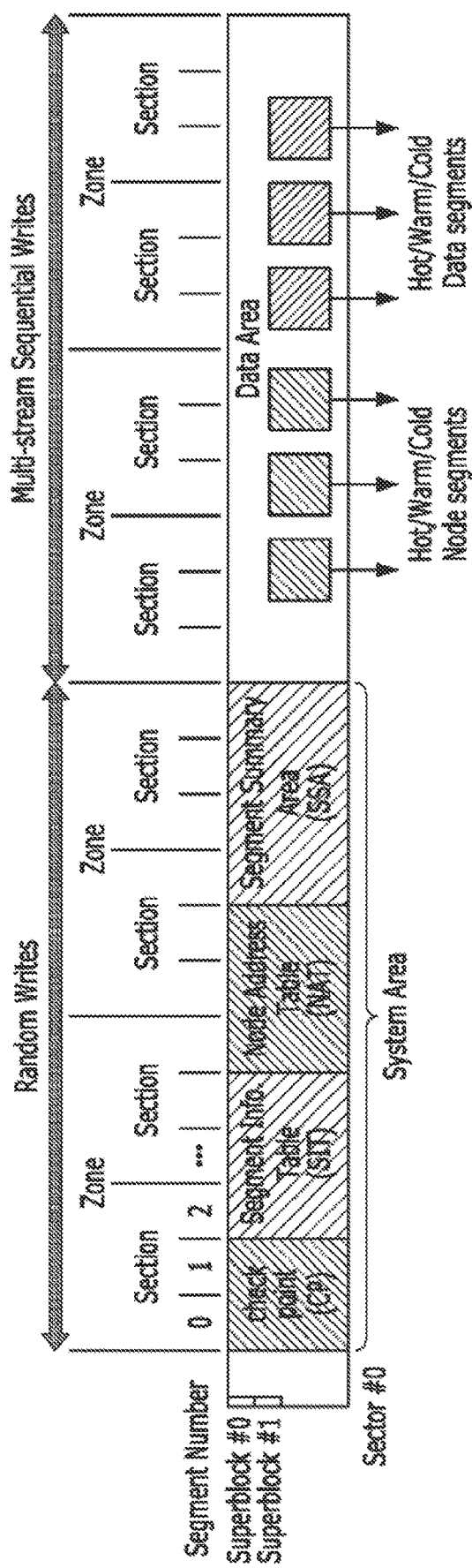
FIGS. 5A and 5B illustrate examples of a file system used in a memory system.
Figure 5B:
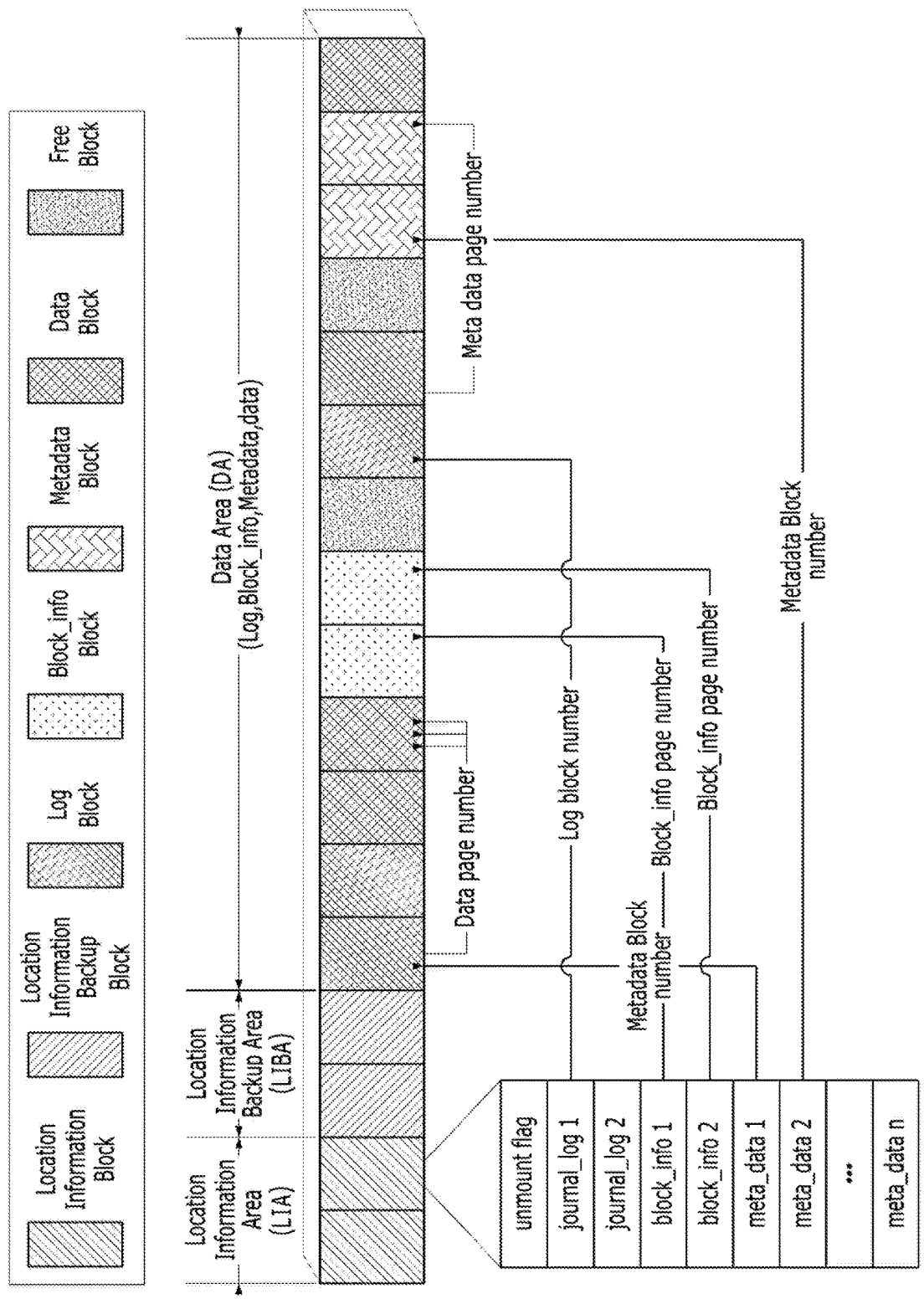

FIG. 5A illustrates a file system structure of the F2FS, and FIG. 5B illustrates a file system structure of the RFFS.

Referring to FIG. 5A, the F2FS may divide the entire memory device into six areas. For example, the six areas may include a data area, a superblock area, a segment summary area SSA, a segment information table SIT, a node address table NAT, and a check point area CP.

The data area may include a plurality of blocks capable of storing user data. Each of the blocks may be used as a node block or a data block. The node block may include an inode or an index of a data block. The data block may include a directory or user data. The node block or the data block may store nodes or data having different attributes according to the attributes (hot, warm, and cold) of the nodes or data.

In an embodiment, each of the blocks in the data area may have a size of 4 KB or 8 KB. Furthermore, one section may include a plurality of node blocks or a plurality of data blocks, but one section may not include node blocks and data blocks together.

The superblock area may include basic partition information and basic parameters of the F2FS.

The segment summary area SSA may store summary items indicating owner information of all blocks within the data area, for example, information on a parent inode and information on child inodes belonging to the parent inode.

The segment information table SIT may include per-segment information such as the number of valid blocks in the data area and bitmap information on the validities of all the blocks within the data area. The information included in the segment information table SIT may be used to select a segment from which data are to be erased, during a process such as garbage collection, and to identify valid blocks within the selected segment.

The node address table NAT may include a block address table for finding all "node blocks" stored in the data area.

The check point area CP may store a file system state, a bitmap for valid information in the segment information table SIT and the node address table NAT, a list of orphan inodes that lost their parent inodes, and a summary item of current active segments. Through the check point CP, the F2FS can provide a consistent recovery point when the SPO event or system collision occurs.

In the F2FS shown in FIG. 5A, the other areas except the data area may be a system area. Log information stored in the system area may be stored at a random position among a plurality of nonvolatile memory blocks. However, user data stored in the data area may be sequentially stored in the plurality of nonvolatile memory blocks. The system area and the data are may be controlled in different manners, and neither be used together nor overlap each other.

Referring to FIG. 5B, the RFFS may divide the entire memory device into three areas. For example, the three areas may include a location information area LIA, a location information backup area LIBA, and a data area DA.

The location information area LIA may include a plurality of blocks or a plurality of segments. When power is applied to a memory system or when the memory system is interconnected to another device such as a host, the location information area LIA may be first scanned. The location information area LIA may store the latest location information of data.

The location information backup area LIBA may be used when a problem occurs while the location information area LIA is scanned or read.

The data area DA may include the other areas except the location information area LIA and the location information backup area LIBA. The data area DA may be used to store all types of information or data such as log information, block information, meta data, user data, and so on.

The location information area LIA in the RFFS may be used to record the locations of various pieces of information or various data. The various pieces of information or various data themselves may be stored in the data area. Therefore, even when the SPO event or system collision occurs, the locations where the log information and the block information are stored may be stored in the location information area LIA, but contents of the log information and the block information may be stored in the data area DA.

In an embodiment, the RFFS shown in FIG. 5B may perform the recovery process more rapidly using special information, e.g., an unmount_flag. When flag information on the log information is set to a first value, e.g., '1,' the memory system may recognize that all tasks were completed before the power supply was cut off and thus there are no errors. In this case, the memory system may omit the recovery process based on the log information. On the other hand, when the flag information is set to a second value, e.g., '0,' it may indicate that there are tasks which were not completed before the power supply was cut off. In this case, the memory system may perform the recovery process based on the log information and the block information.

Figure 6:
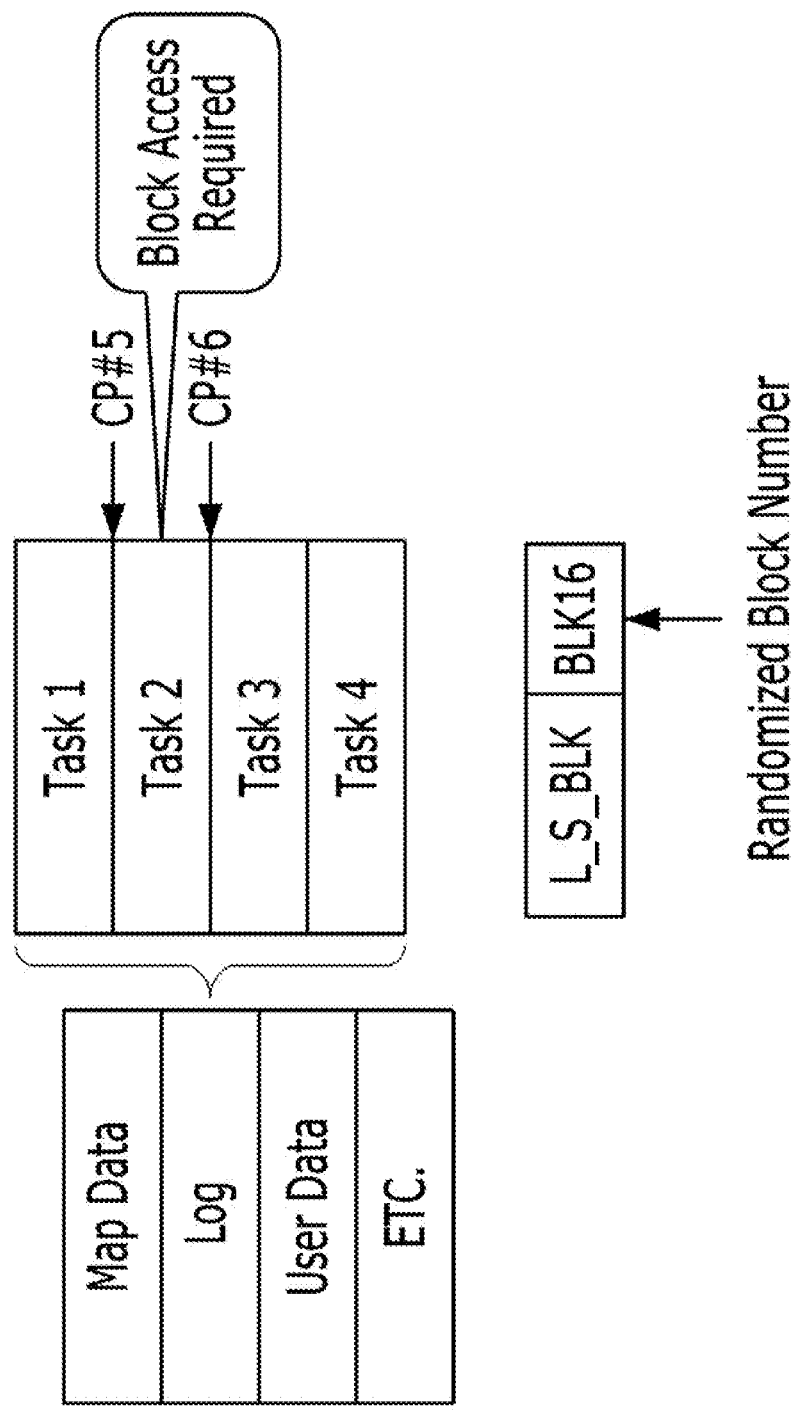
FIG. 6 illustrates a method for generating log information in accordance with an embodiment.

FIG. 6 illustrates a method for generating log information in relation to tasks which the memory system 110 does not complete when the SPO event occurs.

While the memory system 110 operates, the controller 130 may have map information, user data, and the like to perform an operation requested by the host 102. For example, when the controller 130 performs a read operation in response to a read request from the host 102, the controller 130 may use the map information for recognizing a task corresponding to the read operation and a physical location of data to be read. When power supply to the memory system 110 is cut off before the read operation is not completed, the task corresponding to the read operation and the physical location of the data to be read (for example, a physical address) may be included in the log information. After that, when power is supplied to the memory system 110 again, the controller 130 may perform the read operation according to the task and the physical location of the data, which are included in the log information. Therefore, the memory system 110 can recover the previous condition before the power supply was cut off.

For another example, when the controller 130 performs a write operation in response to a write request from the host 102, the controller 130 may use a task corresponding to the write operation, user data to be stored in the memory device 150, and a physical location where the user data are to be written. When the power supply to the memory system 110 is cut off before the write operation is not completed, the controller 130 may include information related to the write operation in the log information.

For example, when it is assumed that four tasks are includes in the log information, a second task, e.g., Task 2, among the four tasks in the log information, may be a task that is required to access a block within the memory device 150. When the SPO event occurs, if the second task Task 2 is not completed, the controller 130 may set check points, e.g., CP #5 and CP #6, before and after the second task Task 2. Furthermore, the controller 130 may decide information L_S_BLK on the block to be accessed in response to the check points CP #5 and CP #6. In this case, the block information L_S_BLK is randomly decided. In FIG. 6, a block BLK16 among a plurality of blocks in the memory device 150 may be randomly selected.

In an embodiment, a range of deciding the randomized block may be changed in response to a task. For example, a task is for reading and testing the entire memory device 150, one of the plurality of blocks in the memory device 150 may be decided as the randomized block. On the other hand, when a task is limited to a preset number of blocks among the plurality of blocks in the memory device 150, one of the preset number of blocks may be decided as the randomized block.

In an embodiment, when deciding the randomized block, a previously selected block may be excluded to avoid repeated access to the previously selected block.

Figure 7:
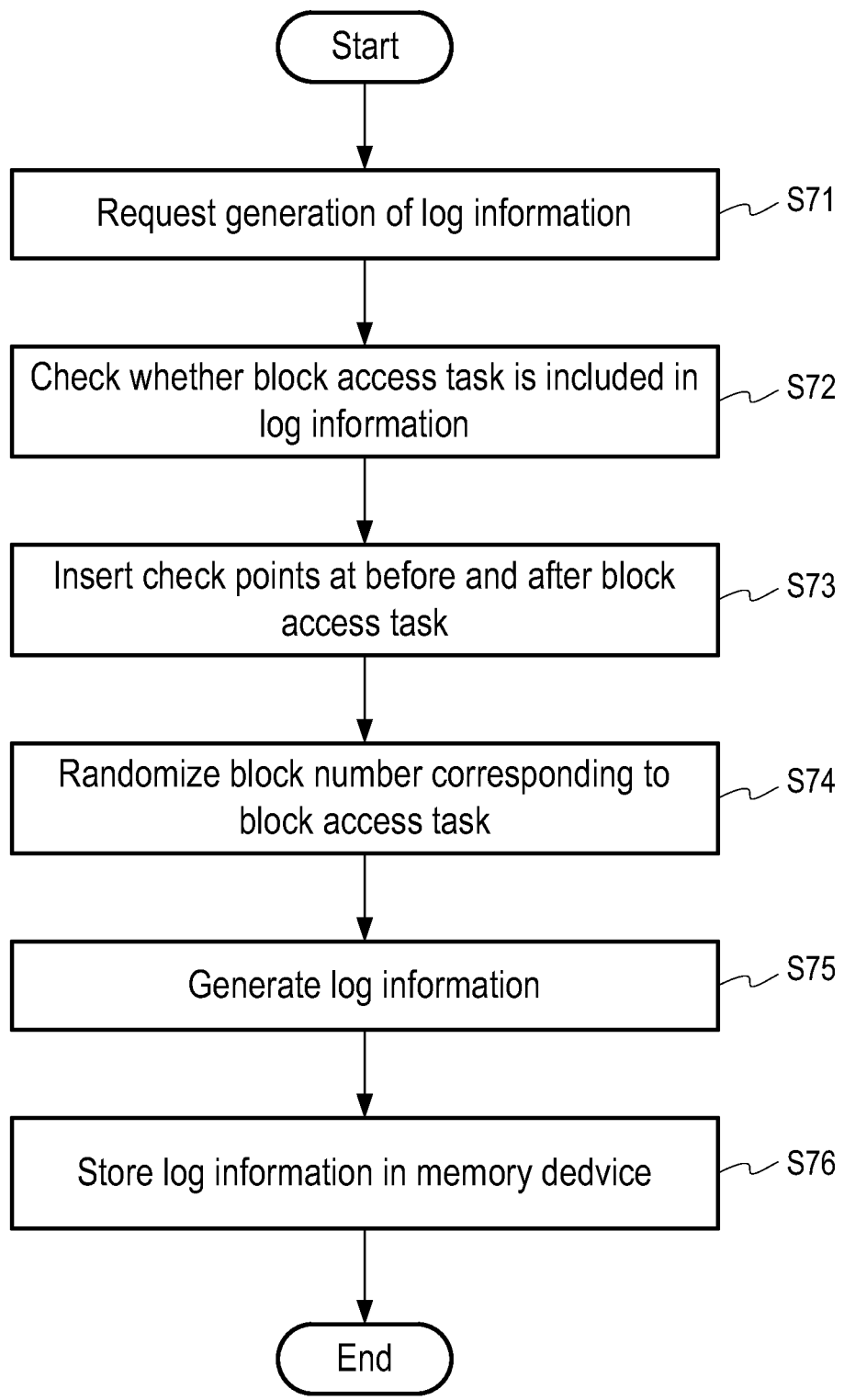
FIG. 7 illustrates a method for generating log information in accordance with an embodiment.

FIG. 7 illustrates a method for generating log information in accordance with an embodiment. The method of FIG. 7 will be described with reference to FIG. 2.

Referring to FIG. 7, when the SPO event occurs and thus the power detection signal PWR indicating the abnormal power state LOW_POWER is provided to the backup unit 135, the backup unit 135 is requested to generate log information at S71.

At S72, the backup unit 135 checks whether a task or event requiring access to a block is included in log information and the task or event has not been completed. The task or event requiring the access to the block may be referred to as a "block access task or event." In this embodiment, it is assumed that there is a task that has not been completed when the SPO event occurs for illustrative convenience.

At S73, the backup unit 135 inserts check points at before and after the block access task in the log information.

At S74, the backup unit 135 randomizes a block number corresponding to the block access task.

At S75, the backup unit 135 generates the log information that includes the check points and the block information L_S_BLK including the randomized block number. In another embodiment, the log information may further include flag information having 1 bit data as described with reference to FIG. 5B, the flag information representing whether or not all tasks and events have been completed before the power supply was cut off.

When the SPO event occurs, the log information may include a task or event that has not been completed, a task or event that is to be performed, and/or a task or event whose completion is not reported yet to the host 102 even though the task or event has been completed. The backup unit 135 inserts check points at before and after a block access task or event that has not been completed when the SPO event occurred, among the events or tasks included in the log information.

As described above, the backup unit 135 may determine all the pieces of the log information for the recovery operation. After that, at S76, the backup unit 135, may store the log information at a preset location within the memory device 150 through the processing unit 136.

Figure 8:
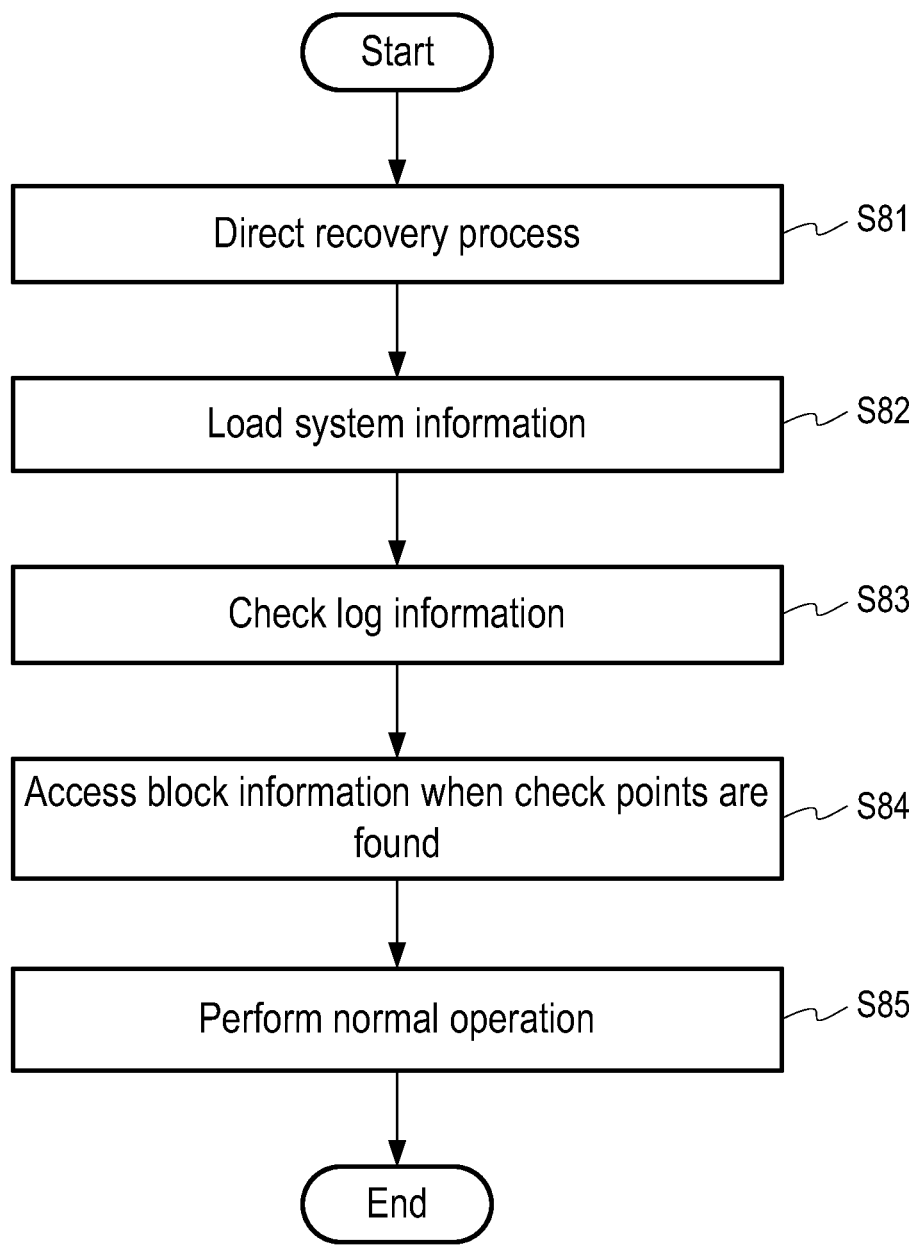
FIG. 8 illustrates a recovery process for a memory system in accordance with an embodiment.

FIG. 8 illustrates a method for performing a recovery process in accordance with an embodiment. The method of FIG. 8 will be described with reference to FIG. 2.

Referring to FIG. 8, when a normal power is supplied to the memory system 110 again and thus the power detection signal PWR indicating the normal power state NORMAL_POWER is provided to the memory system 110, a recovery process is directed at S81.

At S82, the controller 130 loads system information to a memory within the controller 130 to drive the memory system 110. In this embodiment, the system information includes log information. In another embodiment, the log information may be loaded separately from other information of the system information.

FIG. 8 illustrates that loading the system information is performed after directing the recovery process. However, in another embodiment, however, directing the recovery process may be performed after loading the system information. Such an order may be changed depending on a file system structure or a configuration of the system information.

At S83, the recovery unit 137 checks the log information to find check points. The check points may or may not be inserted into the log information. When the check points are found before and after a certain task or event, block information in the log information may be accessed at S84. A block corresponding to the block information is used as a first block that the memory system 110 accesses in response to the certain task or event. The first block which is accessed in response to the certain task or event may be a randomized block.

At S85, the memory system 110 may perform a normal operation (data input/output or the like) with another interworking device. When the power supply is cut off again even though the recovery process is not normally ended, the memory system 110 may perform the recovery process again.

Figure 9:
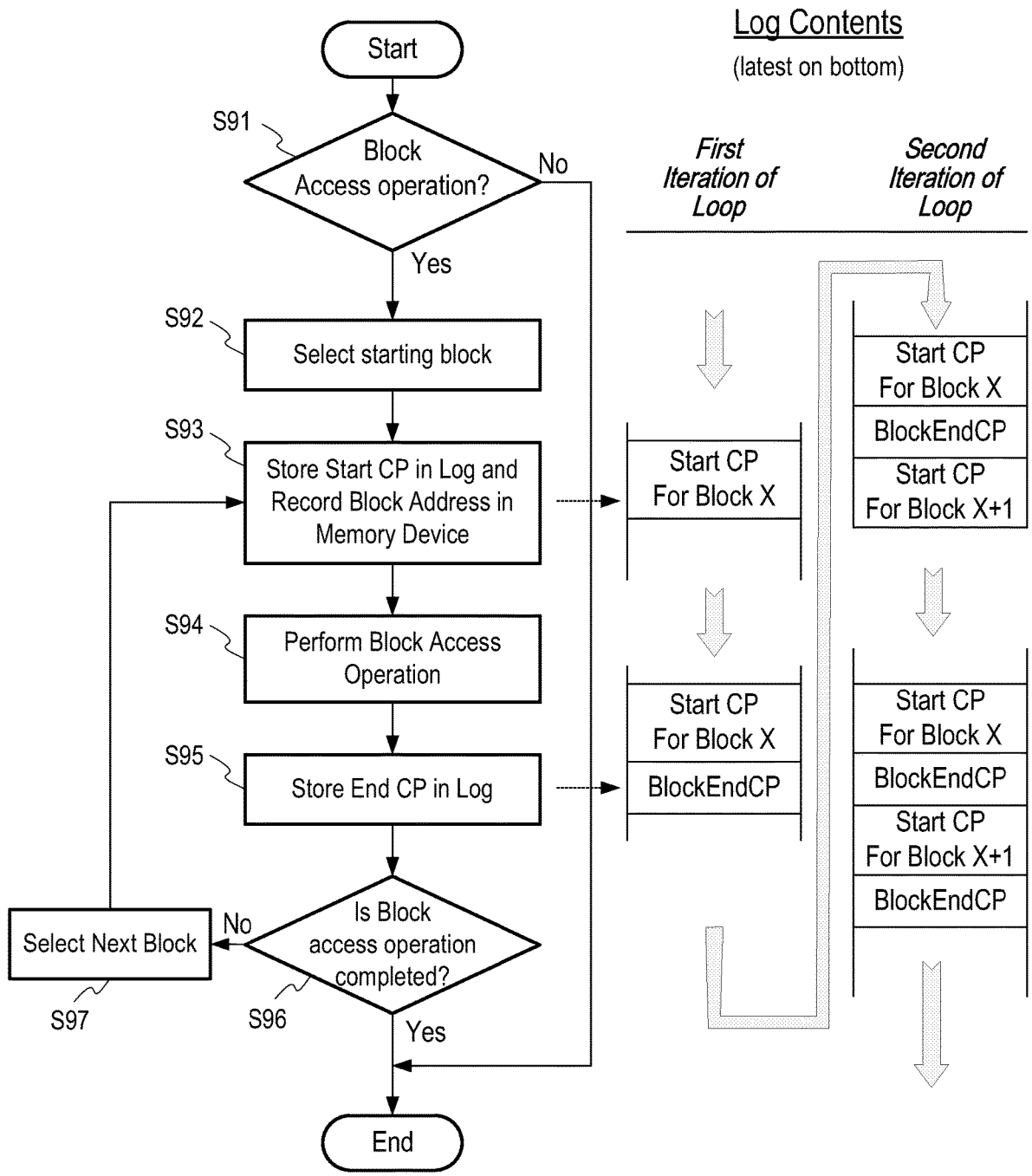
FIG. 9 illustrates a method for processing a block access operation in accordance with an embodiment.

FIG. 9 illustrates a method for processing a block access operation in accordance with an embodiment. The block access operation of FIG. 9 will be described with reference to the memory system 110 of FIG. 1.

It is assumed that a controller, e.g., the controller 130 of FIG. 1, performs an operation of accessing a block of a memory device, e.g., the memory device 150 of FIG. 1, in response to a request from an external device, e.g., the host 102 of FIG. 1.

At S91, the controller 130 of FIG. 1, determines whether an operation requested by the host 102 is an operation including accessing the memory device 150. Herein, the operation including accessing the memory device 150 is referred to as a "block access operation."

When it is determined that the requested operation is not the block access operation at S91, the procedure ends.

On the other hand, when the requested operation is determined as the block access operation at S91, the controller 130 selects a starting block in the memory device 150 to perform the block access operation at S92.

At S93, the controller 130 stores a start check point (CP) in log information, and records a block address of the selected block in the memory device 150. The start CP is assigned to the selected block, e.g., Block X, X being 0 or a positive integer. In this case, the block address of the selected block is a block address X.

In an embodiment, the log information may be stored in a memory of the controller 130 and/or the memory device 150.

At S94, the controller 130 performs the block access operation for the Block X.

After the block access operation for the Block X is completed, at S95, the controller 130 stores an end CP in the log information. The end CP is assigned to the Block X. Therefore, at this point, the log information stored in the memory device 150 may include the start CP and the end CP for the Block X.

Afterwards, at S96, the controller 130 determines whether the block access operation is completed on a predetermined number of blocks on which the block access operation is supposed to be performed.

When it is determined that the block access operation is completed on all the predetermined number of blocks, the procedure ends.

On the other hand, when it is determined that the block access operation is not completed on all the predetermined number of blocks, at S97, the controller 130 selects a next block, e.g., Block X+1. After that, the procedure goes back to S93, and the processes S93 to S95 are performed on the Block X+1.

As a result of the processes of S93 to S95 on the Block X+1, a start CP and an end CP assigned to the Block X+1 may be stored in the log information, and a block address X+1 of the block X+1 is recorded in the memory device 150.

The right side of FIG. 9 shows log contents sequentially stored in the log information during the block access operation.

However, during the block access operation described in FIG. 9, if the SPO event occurs during the process S94 of performing the block access operation for the selected block, the log information includes a start CP for the selected block only. The last log entry of the log information becomes the start CP for the selected block. The last log entry represents the most recent entry of the log information that is entered just before the occurrence of the SPO event.

On the other hand, if the SPO event occurs after the block access operation for the selected block is completed, i.e., the SPO event occurs after the process S95, the log information may include both the start CP and an end CP for the selected block. The last log entry of the log information is the end CP for the selected block.

Figure 10:
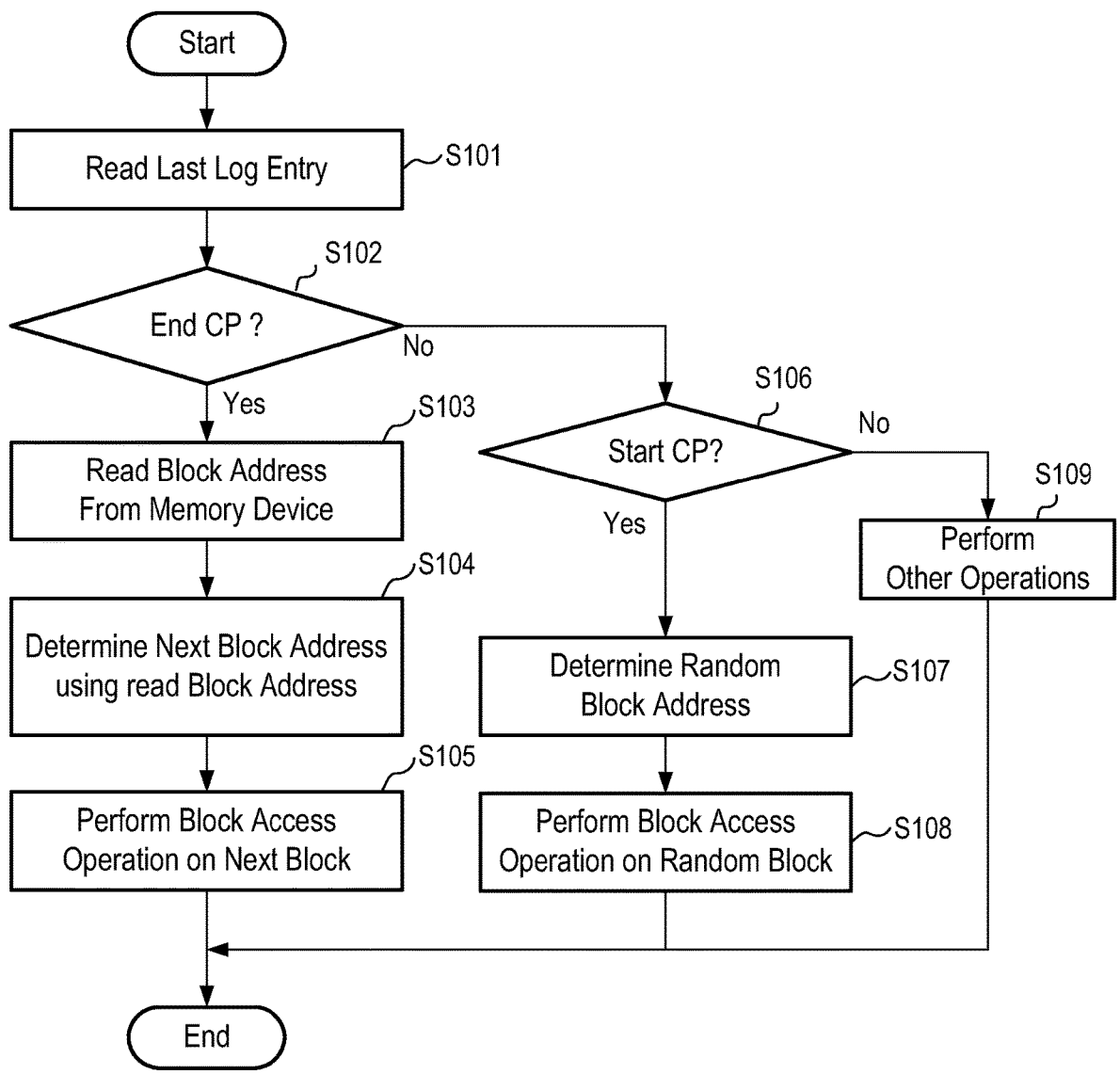
FIG. 10 illustrates a method for performing a recovery operation in accordance with an embodiment.

FIG. 10 illustrates a method for performing a recovery operation in accordance with an embodiment. The recovery operation of FIG. 10 will be described with reference to the memory system 110 of FIG. 1.

The recovery operation of FIG. 10 is performed when a power is applied to and turns on the memory system 110 after the occurrence of the SPO event, and thus is referred to as an "SPO recovery (SPOR)."

At S101, the controller 130 reads the last log entry of the log information.

At S102, the controller 130 determines whether or not the last log entry is an end CP for the selected block that was being accessed just before the occurrence of the SPO event (e.g., herein referred to as "last selected block").

When the last log entry is determined to be the end CP, at S103, the controller 130 reads a block address of the last selected block.

At S104, the controller 130 determines a next block address using the read block address to continue the block access operation of FIG. 9. The last log entry of the end CP indicates that the block access operation for the last selected block has been completed, and the block access operation should be performed on a next block.

At S105, the controller 130 performs the block access operation on the next block using its block address, i.e., the next block address.

Referring back to S102, when it is determined that the last log entry is not the end CP for the last selected block, at S106, the controller 130 determines whether or not the last log entry is a start CP for the last selected block. If it is determined that the last log entry is not the start CP for the last selected block, at S109, the controller 130 performs an operation other than the block access operation. In an embodiment, the other operation is not an operation including accessing a block.

On the other hand, if it is determined that the last log entry is the start CP for the last selected block, at S107, the controller 130 selects a random block address instead of reading the block address of the last selected block that is stored in the memory device 150.

Thereafter, at S108, the controller 130 performs the block access operation on a block corresponding to the randomly selected block address, i.e., a random block. In an embodiment, the random block is selected from a predetermined number of blocks on which the block access operation is supposed to be performed. In an embodiment, the random block is different from the last selected block.

The last log entry of the start CP means that the SPO event occurred while the block access operation was being performed and before the block access operation on the last selected block can be completed. Therefore, in this embodiment, when the SPO event repeatedly occurs, the controller 130 randomly selects a block that is to be accessed and resumes the block access operation on the randomly selected block instead of accessing the last selected block repeatedly.

In the above-described embodiments, when a recovery operation, e.g., an SPOR, is repeatedly performed due to power supply failure, a memory system generates a check point and save the check point in a memory device, and then access different blocks that are randomly selected based on a type of the check point, e.g., a start CP, even though the same tasks or events corresponding to a specific block to which the check point is assigned are repeated. Therefore, although the memory system repeatedly performs the recovery operation while the power supply is unstable, it is possible to avoid wearing of a specific block within the memory device.

Since the embodiments can prevent repeated access to a specific block when the recovery operation of the memory system is repeated in an operation environment where the power supply is unstable, it is possible to reinforce the stability and reliability of the recovery operation and suppress an overhead in the recovery operation of the memory system.

Although various embodiments have been described for illustrative purposes, it will be apparent to those skilled in the art that various changes and modifications may be made without departing from the spirit and scope of the invention as defined in the following claims.

What is claimed is:

1. A method for operating a memory system, the method comprising:
   performing a block access task on a first block in a memory device, the memory device having a plurality of blocks;
   generating log information when a power supply voltage becomes lower than a given level, the log information including a check point and block information, the check point indicating the block access task, the block information indicating a second block; and
   performing the block access task on the second block indicated in the block information of the log information when the power supply voltage becomes equal to or greater than the given level,
   wherein the second block indicated in the block information is randomly selected as a lastly accessed block that is to be accessed first during a recovery operation, and
   wherein the log information further includes flag information representing whether or not all events in the log information have been completed before the power supply voltage becomes lower than the given level.

2. The method of claim 1, wherein the block access task is not completed with respect to the first block when the log information is generated,
   wherein the block access task is one of a plurality of events in the log information.

3. The method of claim 2, wherein the second block indicated in the block information is randomly selected from a subset of the plurality of blocks, the subset being determined according to an event corresponding to the block access task.

4. The method of claim 2, wherein the second block being different from the first block.

5. The method of claim 1, wherein generating the log information includes:
   sequentially arranging events transferred within a preset time range;
   checking whether the block access task is included in the events; and
   inserting the check point at before an event corresponding to the block access task, or after the event corresponding to the block access task, or both.

6. The method of claim 1, further comprising:
   using electrical energy stored in an auxiliary power device when the power supply voltage becomes lower than the given level.

7. The method of claim 1, further comprising:
   storing the log information in the memory device;
   loading the log information into a memory in a controller when the power supply voltage becomes equal to or greater than the given level; and
   identifying the second block in the memory device using the log information.

8. The method of claim 7, further comprising:
   loading system information including firmware and map information to the memory of the controller of the memory system.

9. The method of claim 1, wherein the log information is stored in a first area in the memory device that is randomly selected, user data are sequentially stored in a second area in the memory device, and the first area and the second area are separate from each other.

10. A memory system comprising:
    a memory device including a plurality of blocks; and
    a controller configured to:
    performing a block access task on a first block in the memory device;
    generating log information when a power supply voltage becomes lower than a given level, the log information including a check point and block information, the check point indicating the block access task, the block information indicating a second block; and performing the block access task on the second block indicated in the block information of the log information when the power supply voltage becomes equal to or greater than the given level, wherein the second block indicated in the block information is randomly selected from the plurality of blocks in the memory device as a lastly accessed block that is to be accessed first during a recovery operation, and wherein the log information further includes flag information representing whether or not all events in the log information have been completed before the power supply voltage becomes lower than the given level.

11. The memory system of claim 10, wherein the block access task is not completed with respect to the first block when the log information is generated, wherein the block access task is one of a plurality of events.

12. The memory system of claim 11, wherein the second block indicated in the block information is randomly selected from a subset of the plurality of blocks, the subset being determined according to an event corresponding to the block access task.

13. The memory system of claim 11, wherein the second block being different from the first block.

14. A method for operating a memory system, the method comprising:
  performing a block access operation on a first block in a memory device, the memory device including a plurality of blocks;
  accessing log information after an occurrence of a sudden power-off (SPO) event, the log information including a check point; and
  continuing the block access operation on a second block different from the first block when the check point of the log information indicates that the block access operation was not completed for the first block, wherein a block address of the second block is randomly selected as a lastly accessed block that is to be accessed first during a recovery operation, and wherein the log information further includes flag information representing whether or not all events in the log information have been completed before a power supply voltage becomes lower than a given level.

15. The method of claim 14, further comprising:
  selecting the block address of the second block when the check point in the log information is a start check point, the start check point being the most recent entry of the log information.

16. The method of claim 14, further comprising:
  continuing the block access operation on a third block different from the first block when the log information indicates that the block access operation was completed for the first block.

17. The method of claim 16, wherein the log information includes an end check point for the first block, the end check point being the most recent entry of the log information.

18. The method of claim 14, wherein the log information is generated when the SPO event occurs, the SPO event referring to a state when the power supply voltage to the memory system becomes lower than the given level, the log information including a check point and block information, the check point indicating the block access operation, the block information indicating the second block, and wherein the block access operation is performed on the second block when the power supply voltage becomes equal to or greater than the given level.

* * * * *